(12) United States Patent
Wang et al.

(10) Patent No.: US 11,096,304 B2
(45) Date of Patent: Aug. 17, 2021

(54) CAGES FOR ELECTRONIC COMPONENTS

(71) Applicant: Hewlett-Packard Development Company, L.P., Spring, TX (US)

(72) Inventors: Chien-Yi Wang, Taipei (TW); Tien Liang Chung, Taipei (TW); Justin Tinhsi Lee, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/706,283

(22) Filed: Dec. 6, 2019

(65) Prior Publication Data
US 2021/0176886 A1    Jun. 10, 2021

(51) Int. Cl.
*H05K 7/14* (2006.01)
*G06F 1/18* (2006.01)

(52) U.S. Cl.
CPC ........... *H05K 7/1487* (2013.01); *G06F 1/187* (2013.01); *H05K 7/1489* (2013.01)

(58) Field of Classification Search
CPC ...................................................... G06F 1/187
See application file for complete search history.

(56) References Cited

U.S. PATENT DOCUMENTS

| 4,896,423 A * | 1/1990 | Kinsey ............... A47G 21/02 30/322 |
| 6,222,291 B1 | 4/2001 | Boutaghou |
| 7,342,743 B2 | 3/2008 | Kuwajima |
| 9,886,983 B1 | 2/2018 | Fairchild |
| 2009/0073649 A1* | 3/2009 | Ikeda ............... G11B 33/124 361/679.35 |
| 2013/0112844 A1* | 5/2013 | Wang ............... G11B 33/124 248/636 |

FOREIGN PATENT DOCUMENTS

EP        1612565 B1    1/2011

OTHER PUBLICATIONS

Sedna; Fitting Anti Vibration Hard Drive Mounts; Feb. 26, 2019.

* cited by examiner

*Primary Examiner* — Jerry Wu
(74) *Attorney, Agent, or Firm* — Lakshmi Kumaran & Sridharan

(57) ABSTRACT

A cage for accommodating an electronic component is described, where the electronic component may be susceptible to damage upon impact. The cage may include a first wall, a second wall, a third wall, and a fourth wall. In an example, the first wall and the third wall may be positioned transversely to the second wall and the fourth wall. In an example, a first indentation may be formed on the first wall and a second indentation may be formed on the third wall. In said example, the first indentation and the second indentation may have a gap there between to accommodate the electronic component.

15 Claims, 7 Drawing Sheets

CAGES FOR ELECTRONIC COMPONENTS

BACKGROUND

Electronic devices, such as desktop computers and laptops, generally include electronic components that are assembled together and operably coupled to perform various predefined functions. An electronic component, such as a hard disk drive or an optical disk drive, is assembled onto a chassis of an electronic device using an appropriately designed structure, referred to as a cage.

BRIEF DESCRIPTION OF FIGURES

The detailed description is provided with reference to the accompanying figures, wherein.

Figure 1:
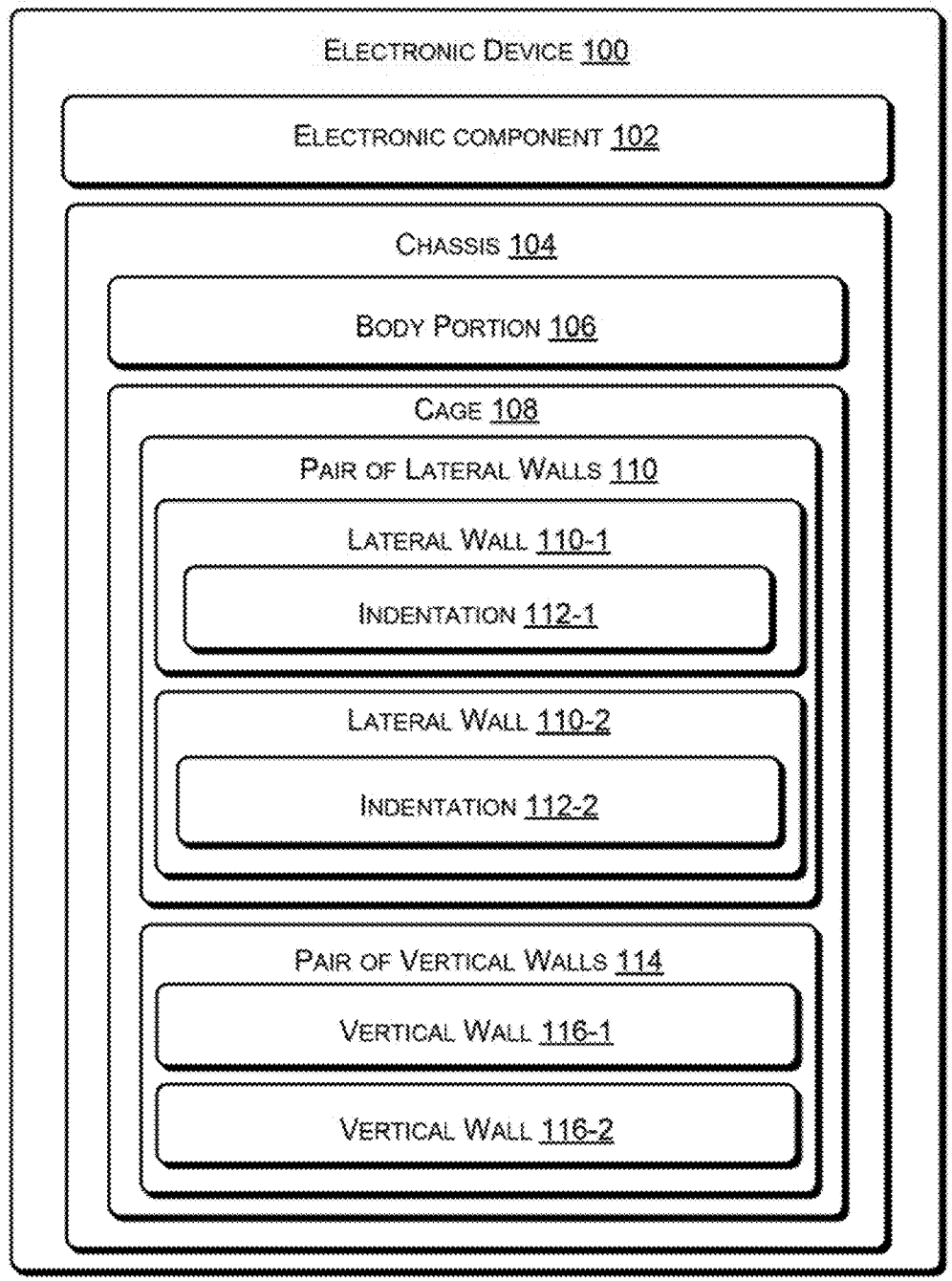
FIG. 1 illustrates a schematic of an electronic device having a cage for an electronic component, according to an example of the present subject matter.

It should be noted that the description and the figures are merely examples of the present subject matter and are not meant to represent the subject matter itself. Throughout the drawings, identical reference numbers designate similar, but not identical, elements. The figures are not to scale, and the size of some parts may be exaggerated to more clearly illustrate the examples shown. Moreover, the drawings provide examples and/or examples consistent with the description; however, the description is not limited to the examples and/or examples provided in the drawings.

DETAILED DESCRIPTION

Cages for accommodating electronic components of an electronic device, such as a personal computer (PC), are mounted onto a chassis of the electronic device and the electronic components are then disposed in the respective cages. Accordingly, each cage is designed in accordance with a shape and a size of an electronic component that the cage is to accommodate. The design consideration while designing the cage is ease of replacement of the electronic component associated with the cage to allow modularity for the electronic component. Such a design may not take into consideration the safety of the electronic components and the electronic components may be left vulnerable to damage upon impact, for example, upon impact on the chassis of the electronic device.

According to example implementations of the present subject matter, cages to accommodate an electronic component are described. The electronic component may be susceptible to damage upon impact and may, for instance, be a hard disk drive (HDD), an optical disk drive (ODD), or a solid-state drive (SSD). The cage may be mounted on a body portion of an electronic device. In an example, the cage may be made of a sheet of metal formed into a rectangular box-like structure. Accordingly, the cage may have a first wall, a second wall, a third wall, and a fourth wall. In an example, the first wall may oppose the third wall and the second wall may oppose the fourth wall, and each wall may be transverse to its adjacent walls. Accordingly, the first wall and the third wall may be positioned transversely to the second wall and the fourth wall respectively.

The cage may further have an indentation formed on each wall of a pair of parallel walls. In one example, each of the first wall and the third wall may have an indentation formed thereon. In another example, each of the second wall and the fourth wall may have an indentation formed thereon. Also, the first wall and the third wall may be referred to as a pair of lateral walls. Further, the second wall and the fourth wall may be referred to as a pair of vertical walls. Accordingly, the indentations may be either formed on the pair of lateral walls or the pair of vertical walls. Each indentation may be formed as a notch in the surface of the metal sheet and may extend out of a plane of the sheet, such that the distance between the opposing indentations is lesser than the distance between the opposing walls on which the indentations are formed. In other words, each indentation may extend from the plane of the sheet on which it is formed towards the other indentation. In an example, the indentations may be formed to be directly facing each other. In another example, however, the indentations may be formed to be offset from each other. In a gap between the pair of indentations, the electronic component may be accommodated with a tight fit between the indentations and the electronic component.

The provision of the indentations to accommodate the electronic component may protect the electronic component from an impact experienced by the cage to the electronic component. Further, the sheet of metal used for making the cage may be selected to have a high thickness. In an example, the thickness of the sheet of metal may be about 0.8 millimeter (mm). The sheet of metal so selected may also absorb a substantial part of the impact. The sheet of metal may further firmly hold the electronic component from falling off the cage when the impact is experienced by the cage, thereby reducing any chances of physical damage to the electronic component. This, in turn, may reduce vulnerability of the electronic component to any adverse effect on the electronic device to the shock or impact. Moreover, the indentations so designed allow the manufacturing of the cage without making any substantial modifications to the tooling used for manufacturing the cage.

The above aspects are further described in conjunction with the figures, and in associated description below. It should be noted that the description and figures merely illustrate principles of the present subject matter. Therefore, various arrangements that encompass the principles of the present subject matter, although not explicitly described or shown herein, may be devised from the description and are included within its scope.

FIG. 1 illustrates a schematic of an electronic device 100, in accordance with an example of the present subject matter. The electronic device 100 may be a central processing unit (CPU) in an assembled state, that may include an electronic component 102 that may be susceptible to damage upon impact. The electronic device 100 may further include a chassis 104 having a body portion 106 and a cage 108 mounted on the body portion 106. The body portion 106 can be, for instance, a housing of the electronic device 100 for accommodating various components of the electronic device 100 and the chassis 104 can be, for instance, a structural framework for supporting the housing.

In an example, the cage 108 may include a pair of lateral walls 110 and a pair of vertical walls 114, for instance, to form a rectangular enclosure. An electronic component 102 of the electronic device 100 may be accommodated in the cage 108. It should be noted that while the pair of lateral walls 110 and the pair of vertical walls 114 have been described to form the rectangular enclosures, the pair of lateral walls 110 and the pair of vertical walls 114 may form enclosures of other shapes as well, such as, trapezoidal. In an example, the shape of the enclosure may be defined by the shape of the electronic component to be enclosed therewith. For ease of reference and clarity, the pair of lateral walls 110 has been depicted as a lateral wall 110-1 and lateral wall 110-2. Similarly, the pair of vertical walls 114 has been depicted as a vertical wall 114-1 and a vertical wall 114-2.

According to an aspect, each wall of the pair of lateral walls 110 may have an indentation provided thereon. In other words, the lateral wall 110-1 may have an indentation 112-1 formed thereon and the lateral wall 110-2 may also have an indentation 112-2 formed thereon. The indentations 112-1 and 112-2 may have a gap therebetween, the gap being measured between respective planes of the indentations 112-1 and 112-2. In said aspect, the gap between the indentations 112-1 and 112-2 is smaller than a gap between the lateral wall 110-1 and the lateral wall 110-2.

Figure 2:
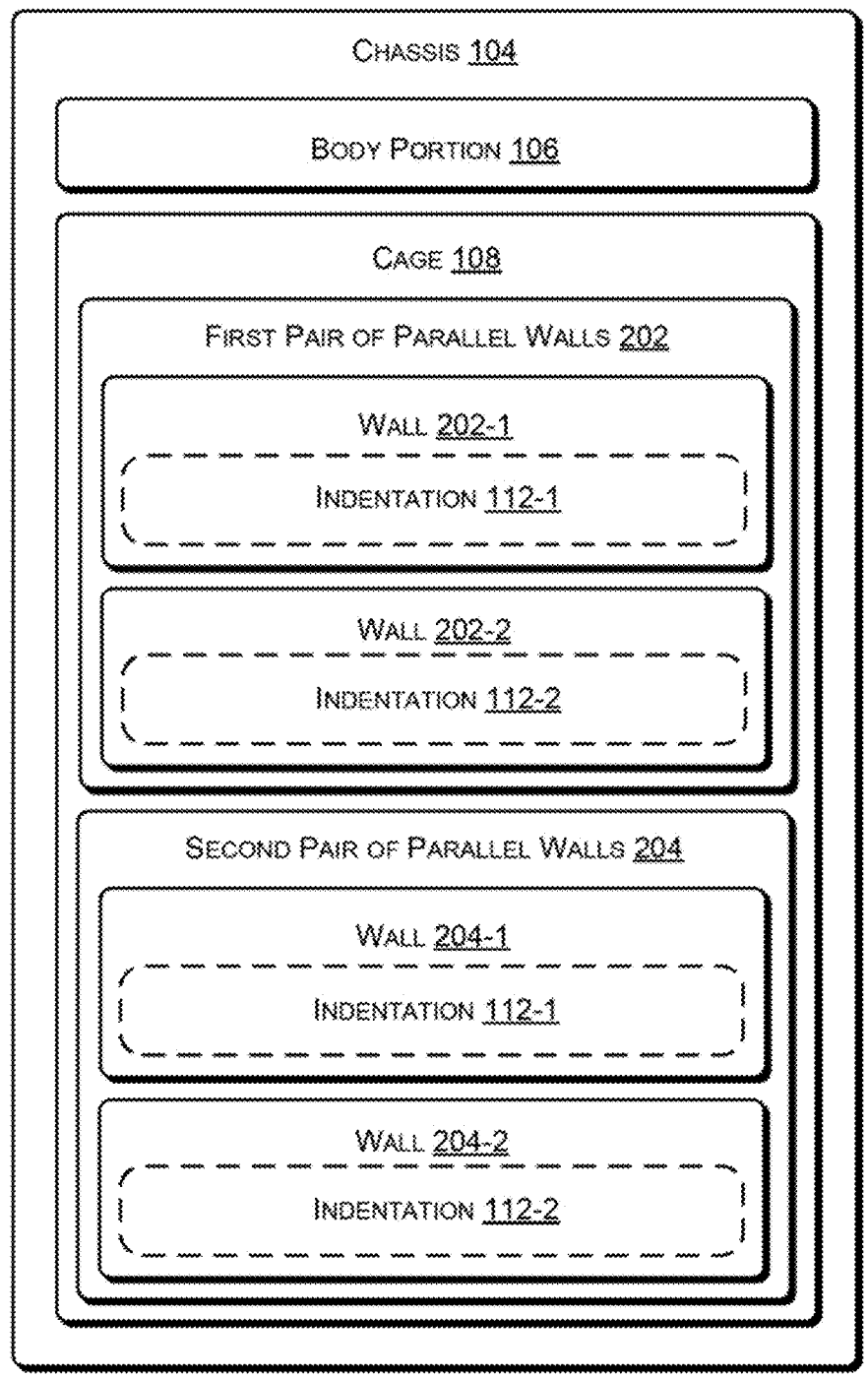
FIG. 2 illustrates a schematic of a chassis of an electronic device having a cage for an electronic component, according to an example of the present subject matter.

FIG. 2 illustrates a schematic of the chassis 104, in accordance with an example of the present subject matter. As already discussed, the chassis 104 may include the body portion 106 and the cage 108 mounted on the body portion 106. The cage 108 may further have a first pair of parallel walls 202 and a second pair of parallel walls 204. In an example, the first pair of parallel walls 202 may be positioned transversely to the second pair of parallel walls 204. Such an arrangement of the first pair of parallel walls 202 and the second pair of parallel walls 204 may form a cavity to accommodate the electronic component 102 that is susceptible to damage upon impact. For ease of reference and clarity, the first pair of parallel walls 202 has been depicted as a wall 202-1 and a wall 202-2. Similarly, the second pair of parallel walls 204 has been depicted as a wall 204-1 and a wall 204-2. The first pair of parallel walls 202 may correspond to the pair of lateral walls 110 shown in FIG. 1, and the second pair of parallel walls 204 may correspond to the pair of vertical walls 114 shown in FIG. 1.

In an example, the wall 202-1 and the wall 202-2 may be substantially parallel to each other. Similarly, the wall 204-1 and the wall 204-2 may be substantially parallel to each other.

Further, both walls of the first pair of parallel walls 202 may each have an indentation formed thereon. In an example, the indentation 112-1 may be formed on the wall 202-1 and the indentation 112-2 may be formed on the wall 202-2. Alternatively, in another example, each wall of the second pair of parallel walls 204 may have an indentation formed thereon. Accordingly, in the latter example, the indentation 112-1 may be formed on the wall 204-1 and the indentation 112-2 may be formed on wall 204-2. The indentations 112-1 and 112-2 so formed may extend into the cavity and may abut the electronic component 102 when the electronic component 102 is inserted into the cage 108.

Figure 3:
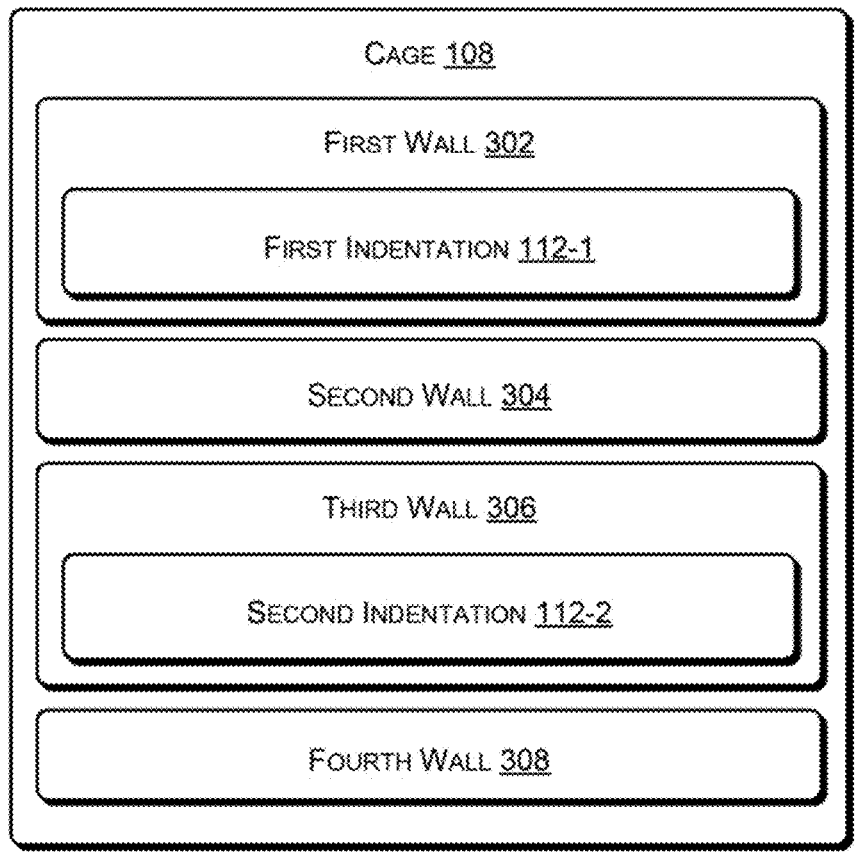
FIG. 3 illustrates a schematic of a cage for an electronic component of an electronic device, according to an example of the present subject matter.

FIG. 3 illustrates a schematic of the cage 108 to accommodate the electronic component 102, in accordance with an example of the present subject matter. In an example, the electronic component 102 may be susceptible to damage upon impact.

The cage 108 may comprise a first wall 302, a second wall 304, a third wall 306, and a fourth wall 308. In an example, the first wall 302 may oppose the third wall 306 and the second wall 304 may oppose the fourth wall 308. In said example, the first wall 302 and the third wall 306 may be positioned transversely to the second wall 304 and the fourth wall 308.

In an example, the first wall 302 and the third wall 306 may correspond to the first pair of parallel walls 204 shown in FIG. 2, and the second wall 304 and the fourth wall 308 may correspond to the second pair of parallel walls 208 shown in FIG. 2.

The cage 108 may further have a first indentation 112-1 formed on the first wall 302 and a second indentation 112-2 formed on the third wall 306. Further, as explained above, the first indentation 112-1 and the second indentation 112-2 may have a gap therebetween and, in an example, the gap between the first indentation 112-1 and the second indentation 112-2 may be less than a gap between the first wall 302 and the third wall 306. In said example, the first indentation 112-1 and the second indentation 112-2 may abut the electronic component 102 when the electronic component 102 is inserted into the cage, such that, the electronic component 102 is unable to move in relation to the cage 108, for instance, in case of an impact on the cage 108.

The provision of the first indentation 112-1 and the second indentation 112-2 on the first wall 302 and the third wall 306, respectively, has been described as an example. As has been explained previously, in another example, the first indentation 112-1 and the second indentation 112-2 may also be formed on the second wall 304 and the fourth wall 308, respectively, of the cage 108.

FIG. 4A, FIG. 4B, FIG. 4C, and FIG. 4D illustrate different perspective views of the cage 108, in accordance with an example of the present subject matter. FIG. 4A, FIG. 4B, FIG. 4C, and FIG. 4D illustrate the cage in an unassembled position, that is, when the cage is not mounted on the chassis 104 and does not have the electronic component 102 accommodated therein. For the sake of brevity and understanding, FIG. 4A, FIG. 4B, FIG. 4C, and FIG. 4D are described in conjunction with each other.

As discussed above, the cage 108 may be used to accommodate the electronic component 102 susceptible to damage upon impact. Examples of the electronic component 102 may include a hard disk drive (HDD), a solid-state drive (SSD), and an optical disk drive (ODD).

Further, as discussed above, the cage 108 may have the first wall 302 which may be opposite to the third wall 306 and the second wall 304 which may be opposite to the fourth wall 308. Accordingly, the first wall 302 and the third wall 306 may be positioned transversely to the second wall 304 and the fourth wall 308. In other words, the first wall 302 is transverse to the second wall 304 and the fourth wall 308, and the third wall 306 is also traverse to the second wall 304 and the fourth wall 308.

In an example, the first wall 302 may be parallel to the third wall 306 and the second wall 304 may be parallel to the fourth wall 308. In said example, the first wall 302 and the third wall 306 may be positioned transversely to the second wall 304 and the fourth wall 308.

In one example discussed above, the first wall 302 may have the indentation 112-1 and the third wall 306, parallel to the first wall 302, may also have the second indentation 112-2 formed thereon. The indentations 112-1 and 112-2 may firmly hold the electronic component 102 and may restrict any movement of the electronic component 102 in case of an impact on the cage 108.

In another example, however, the first wall 302 or the third wall 306 or both may have multiple indentations formed thereon. For example, each of the first wall 302 and the third wall 306 may have any appropriate number of indentations formed thereon so as to be able to achieve the function of protecting the electronic component 102 from impact. Accordingly, for instance in the example shown in FIG. 4B, in addition to the indentation 112-1, the first wall 302 may have another indentation 402 formed thereon. Similarly, in addition to the indentation 112-2, the third wall 306 may have another indentation 404 formed thereon. For ease of reference, the indentations 112-1 and 402 have been collectively referred to as first indentation 112-1, and the indentations 112-2 and 404 have been referred to as the second indentation 112-2, hereinafter.

Furthermore, the first indentation 112-1 and the second indentation 112-2 may be formed on corresponding positions on the first wall 302 and the third wall 306 respectively. Accordingly, the first indentation 112-1 may be formed to mutually face the second indentation 112-2. In another example, the first indentation 112-1 may be formed to be in an offset position on the first wall 302 with respect to the position of the second indentation 112-2 on the third wall 306. Moreover, the first indentation 112-1 and the second indentation 112-2 may have different shapes and sizes. The shapes and sizes of the first indentation 112-1 and the second indentation 112-2 may be determined based on several factors. For example, the shape and size the first indentation 112-1 and the second indentation 112-2 may be based on a shape and size of the cage 108, on a shape and size of the electronic component 102 to be accommodated in the cage 108, on the type of the material being used for constructing the cage 108, on the number of indentations being formed on the walls 302, 304, 306, and 308 of the cage 108, or on the basis of a combination thereof.

In an example, the electronic component 102 may be accommodated in the cage 108 in the gap between the first indentation 112-1 and the second indentation 112-2, where the gap between the first indentation 112-1 and the second indentation 112-2 may be a gap between a plane of the first indentation 112-1 and a plane of the second indentation 112-2. In said example, the gap between the first indentation 112-1 and the second indentation 112-2 may be determined in a way, such that, the electronic component 102 may be accommodated with a tight fit therewith.

In an example, the cage 108 may be constructed using a metallic material, such as aluminum, steel, cold-rolled steel, copper, metalized vacuum-formed plastic, and alloys or combinations thereof. Such materials may provide rigidity in addition to electrical conductivity and grounding. The cage 108 may be constructed by using a sheet of one of the above-mentioned metallic materials, for example, by stamping the sheet. For instance, the first indentation 112-1 may be formed on the first wall 302 by stamping the first wall 302 towards the third wall 306. Similarly, the second indentation 112-2 may be formed on the third wall 306 by stamping the third wall 306 towards the first wall 302. In other words, the first indentation 112-1 may be a stamped indentation on the first wall 302 towards the third wall 306. Similarly, the second indentation 112-2 may be a stamped indentation on the third wall 306 towards the first wall 302.

In addition, in one example, the sheet used for making the cage 108 may have a high thickness, such as that of about 0.8 mm. Accordingly, in said example, the first wall 302, the second wall 304, the third wall 306, and the fourth wall 308 may have a thickness of about 0.8 mm. Similarly, each wall of the first pair of parallel walls 202 and the second pair of parallel walls 204 shown in FIG. 2, may have a thickness of about 0.8 mm. In another example, the sheet may have differential thicknesses such that the cage 108 so formed may also have differential thicknesses in different portions. In said example, for instance, the walls having the indentations 112-1 and 112-2, i.e., the first wall 302 and the third wall 306, may have a high thickness of about 0.8 mm, while the other walls on which the indentations 112-1 and 112-2 are not formed, i.e., the second wall 304 and the fourth wall 308 may have a lesser thickness. For instance, in said example, the second wall 304 and the fourth wall 308 may have a thickness of about 0.5 mm. The reduction in the thickness of the second wall 304 and the fourth wall 308 may facilitate in reduction of the overall weight of the cage 108.

Figure 4A:
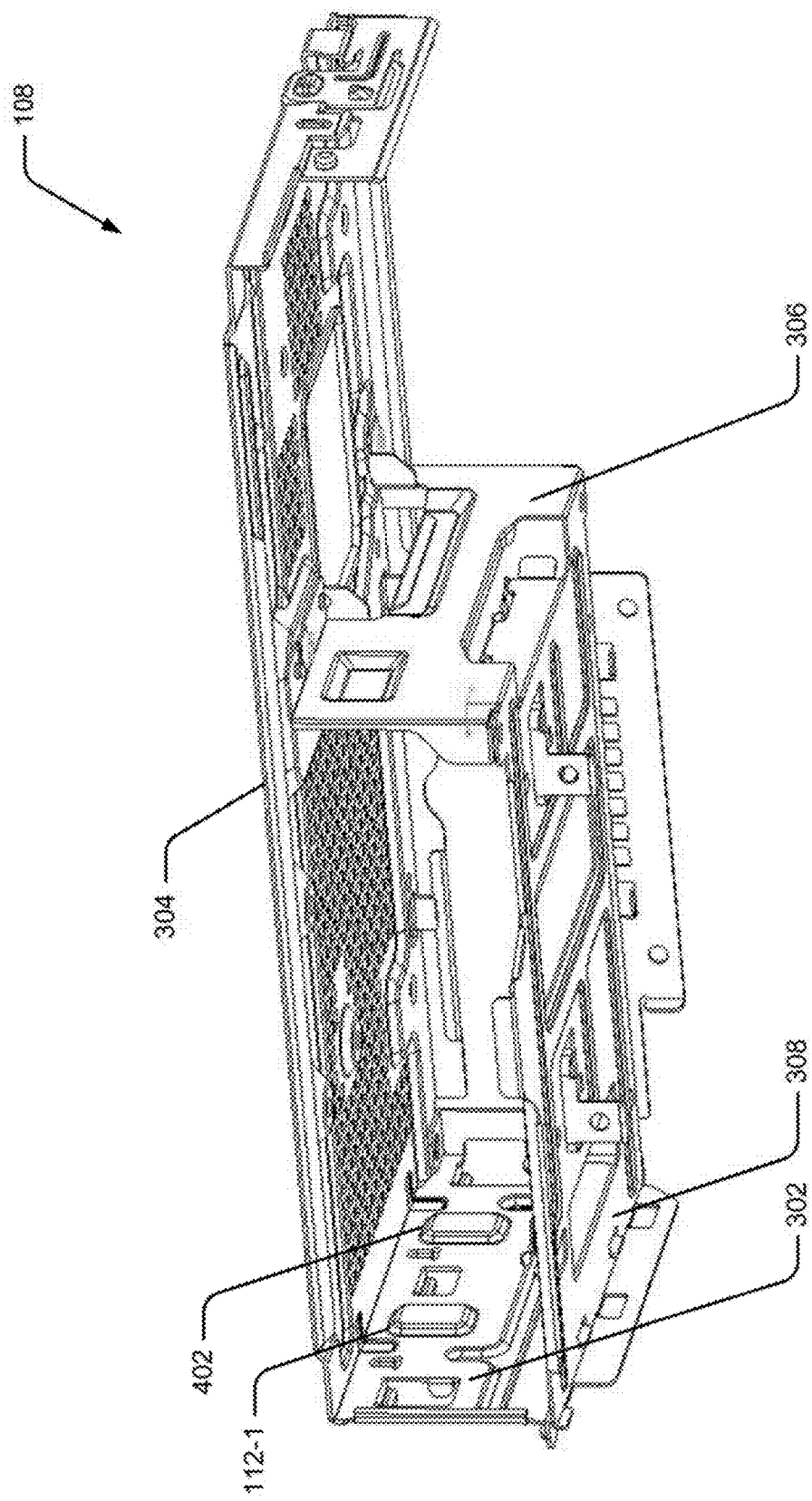
FIGS. 4A, 4B, 4C, and 4D illustrate a cage for an electronic component, according to another example of the present subject matter.
Figure 4B:
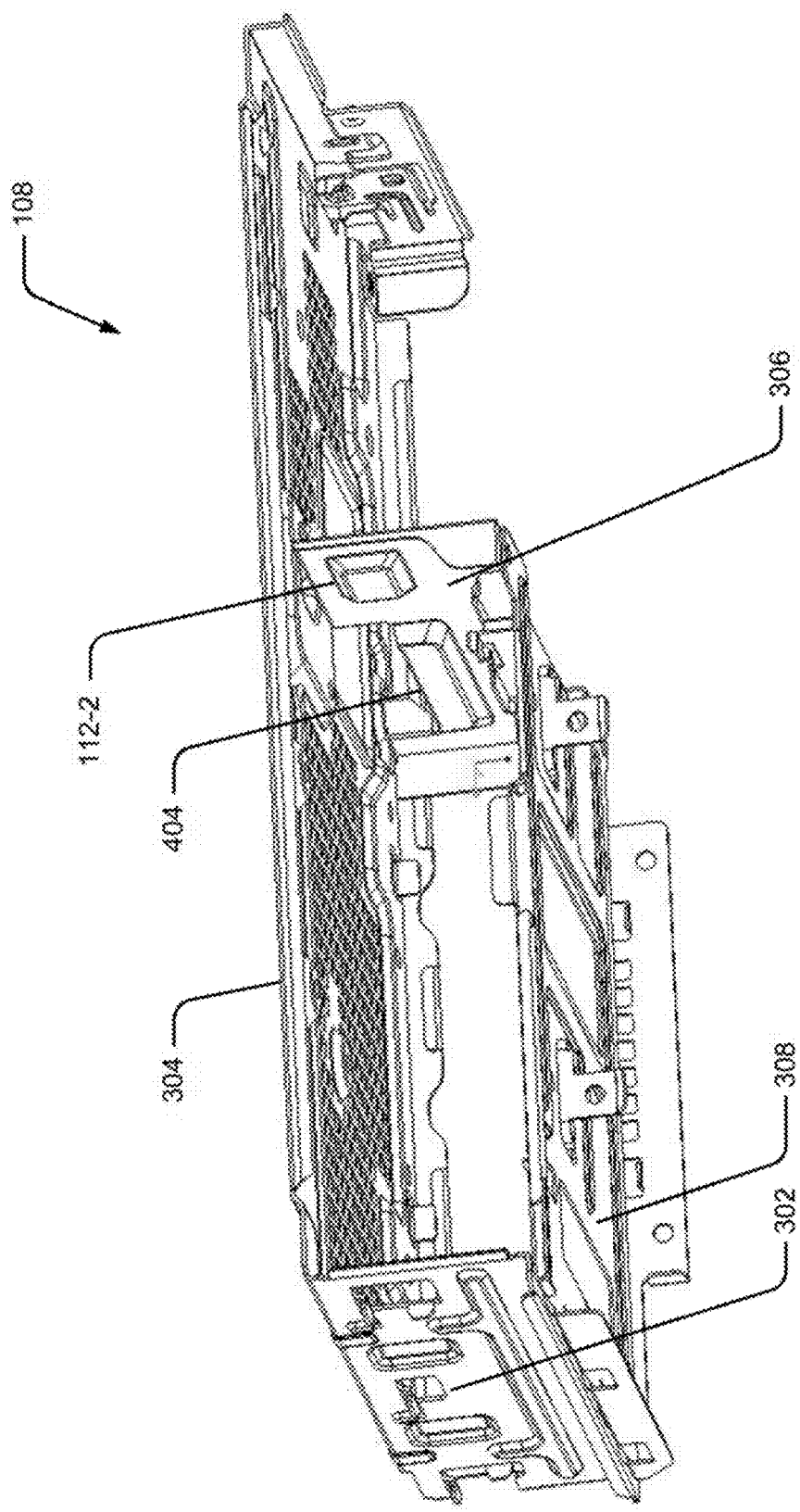
Figure 4C:
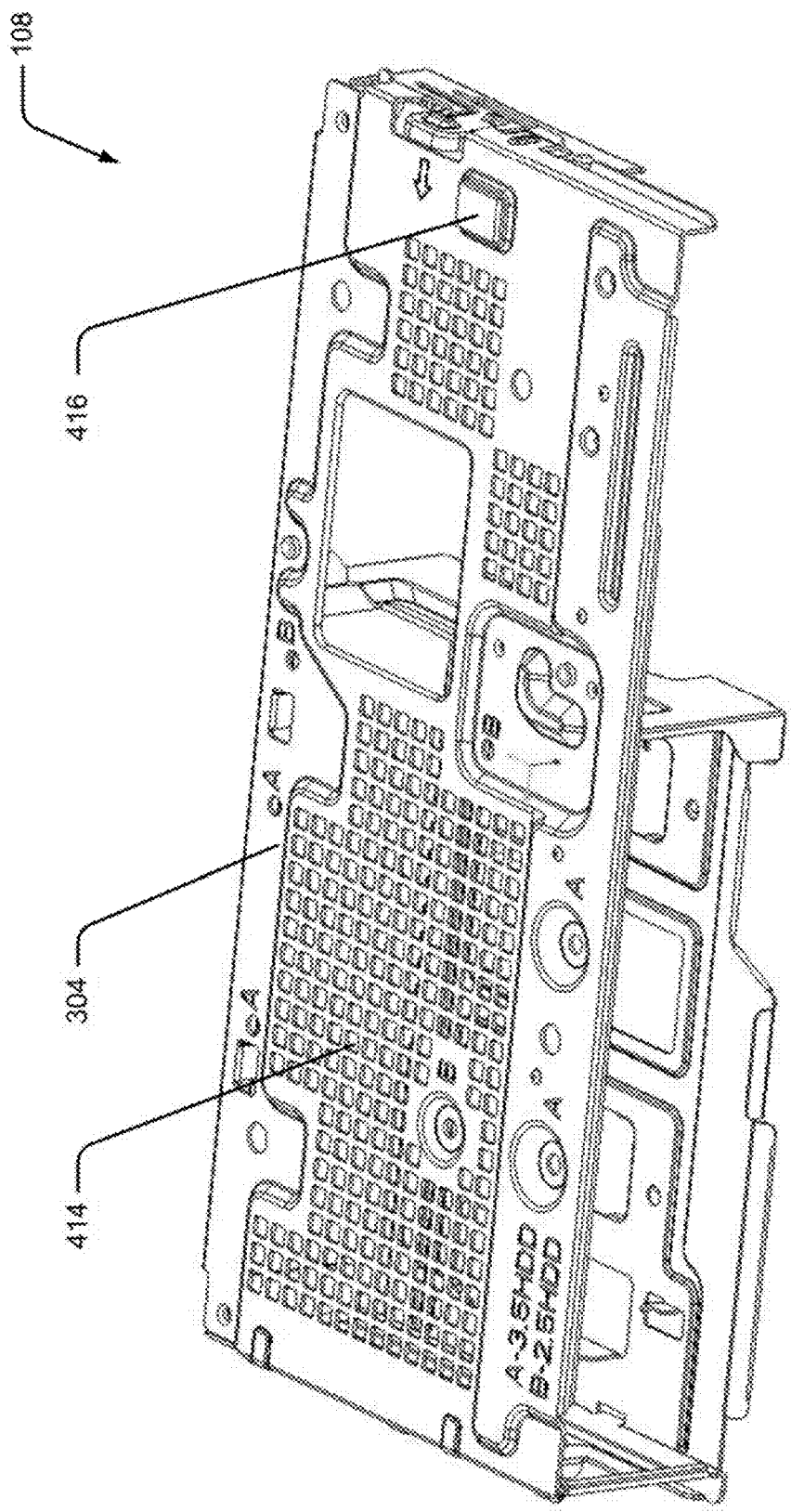
Figure 4D:
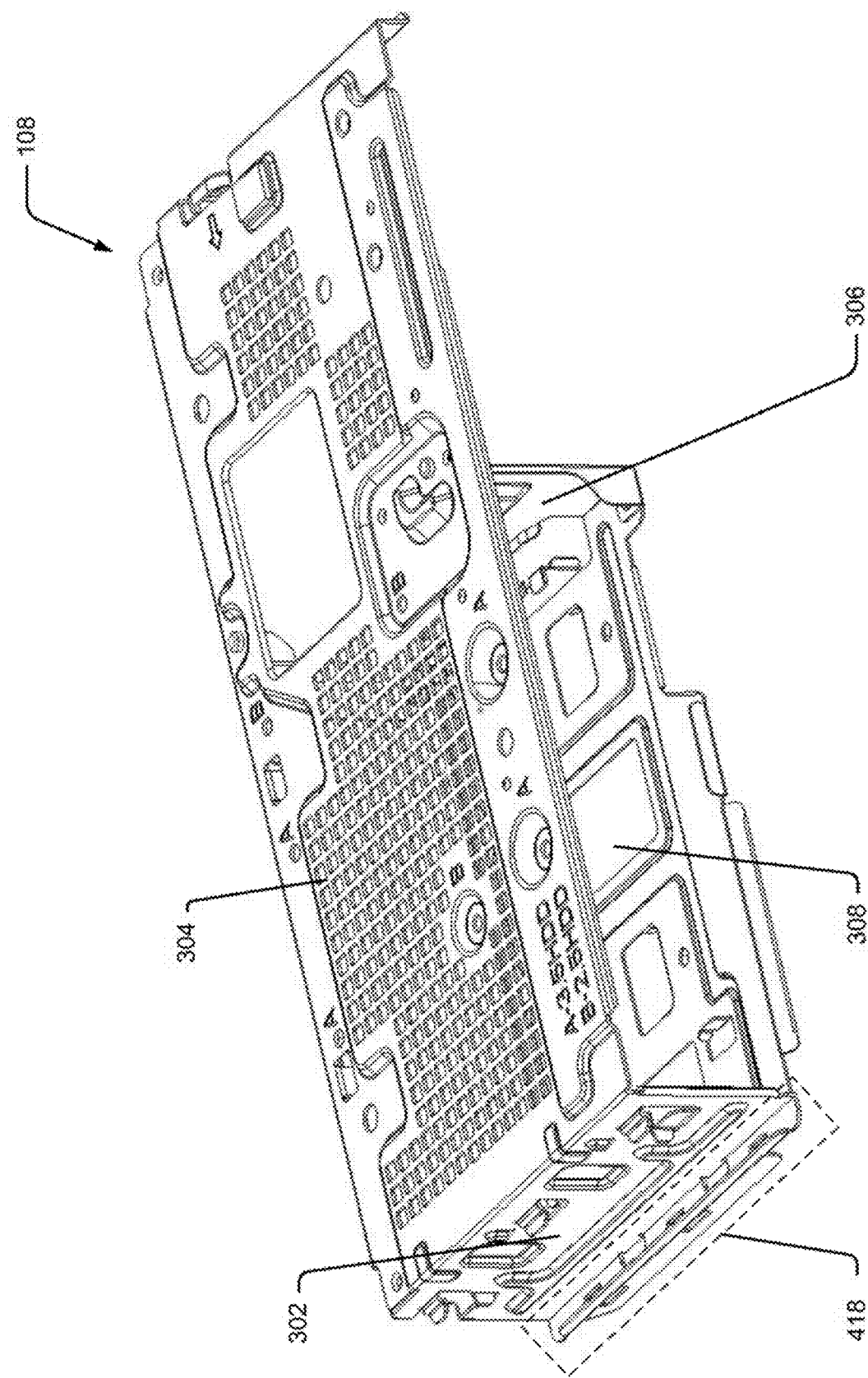

Further, as shown in FIG. 4C and FIG. 4D, the cage 108 may have a mesh structure 414 that may allow the heat generated in operation of the electronic component 102 to escape the cage 108. In an example, the mesh structure 414 can be formed on the walls 304 and 308 on which the indentations 112-1 and 112-2 are not formed. Accordingly, in the above example where the indentations are formed on the first wall 302 and the third wall 306, the second wall 304 and the fourth wall 308 may have the mesh structure 414.

The cage 108 may further have a shock absorber 416 which, in an assembled state of the cage 108 with the chassis 104, may be positioned between the chassis 104 and the cage 108. In an example, the cage 108 may have a protuberance formed thereon and the shock absorber 416 may be disposed on the protuberance. The shock absorber 416 may be made of different materials such as, rubber, neoprene, and silicone. The shock absorber 416 may protect the cage 108 from impacts by absorbing a substantial part of the impact on the chassis 104.

The cage 108 may further include a plurality of mounting brackets to mount the cage on the body portion 106 of the chassis 104. In an example, a mounting bracket may be provided on each of the first wall 302 and the third wall 306. For instance, a first mounting bracket 418 may be formed on the first wall 302 and a second mounting bracket (not shown) may be formed on the third wall 306. It is envisioned that any type of fastener may be utilized to attach the cage 108 to the body portion 106, where the fastener may include, but not limited to, metallic screws, plastic screws, plastic taps, spot welding, and rivets. Metallic fasteners may provide an electrical contact with the chassis, for example, for electrical and/or electromagnetic interference (EMI) grounding.

It should be further noted that while the indentations have been described to be formed on the first wall 302 and the third wall 306, the indentations may alternatively or additionally be formed on the second wall 304 and the fourth wall 308. In other words, along with the first indentation 112-1 and the second indentation 112-2 formed on the first wall 302 and the third wall 306 respectively, a third indentation (not shown) and a fourth indentation (not shown) may also be formed on the second wall 304 and the fourth wall 308 respectively. In an example, the third indentation may be a stamped indentation on the second wall 304 towards the fourth wall 308. Similarly, the fourth indentation may be a stamped indentation on the fourth wall 308 towards the second wall 304. It should be further noted that while the above examples have been explained with respect to the first indentation 112-1 and the second indentation 112-2, the same examples are also applicable to the third indentation and the fourth indentation.

Accordingly, the third indentation and the fourth indentation, along with the first indentation 112-1 and the second indentation 112-2, may abut the four faces of the electronic component 102, thus restricting any movement of the electronic component 102 in case of any impact on the chassis 104 or the cage 108. This, in turn, may reduce any chances of physical damage to the electronic component 102.

Although examples of the present subject matter have been described in language specific to methods and/or structural features, it is to be understood that the present subject matter is not limited to the specific methods or features described. Rather, the methods and specific features are disclosed and explained as examples of the present subject matter.

We claim:

1. A cage to accommodate an electronic component, comprising:
   a first wall, a second wall, a third wall, and a fourth wall to form a cavity therein, wherein:
      the first wall is opposed to the third wall and the second wall is opposed to the fourth wall;
      the first wall and the third wall are positioned transversely to the second wall and the fourth wall; and
      a mesh structure is formed on the second wall to allow heat generated during operation of the electronic component to escape;
   a first indentation formed on the first wall and a second indentation formed on the third wall, wherein:
      the first indentation and the second indentation are substantially rectangularly shaped and differently sized;
      the third wall includes an aperture located adjacent to the second indentation and spanning a length of the second indentation;
      a gap between the first indentation and the second indentation is smaller than a gap between the first wall and the third wall; and
      the first indentation and the second indentation is to abut the electronic component when the electronic component is inserted into the cage; and
   a chassis, comprising:
      a body portion;
      a protuberance extending from the second wall away from the cavity; and
      a shock absorber located on the protuberance between the chassis and the cage.

2. The cage as claimed in claim 1, wherein the cage further comprises a third indentation formed on the second wall and a fourth indentation formed on the fourth wall.

3. The cage as claimed in claim 2, wherein the third indentation is a stamped indentation on the second wall towards the fourth wall, and wherein the fourth indentation is a stamped indentation on the fourth wall towards the second wall.

4. The cage as claimed in claim 1, wherein the first indentation is a stamped indentation on the first wall towards the third wall, and wherein the second indentation is a stamped indentation on the third wall towards the first wall.

5. The cage as claimed in claim 1, wherein a thickness of the first wall and the third wall is about 0.8 mm.

6. A chassis comprising:
   a body portion;
   a cage mounted on the body portion, the cage comprising:
      a first wall, a second wall, a third wall, and a fourth wall, wherein:
         the first wall and the third wall are positioned transversely to the second wall and the fourth wall;
         the first wall, the second wall, the third wall, and the fourth wall form a cavity therein;
         the cavity is to accommodate an electronic component; and
         a mesh structure formed on the second wall to allow heat generated during operation of the electronic component to escape;
      a protuberance further extending from the second wall away from the cavity;
      an indentation formed on each of the first wall, the second wall, the third wall, and the fourth wall, wherein:
         each of the indentations extend into the cavity and is to abut the electronic component when the electronic component is inserted into the cage;
         each of the indentations are substantially rectangularly shaped and differently sized; and
         the third wall includes an aperture located adjacent to an indentation included on the third wall and spanning a length of the indentation on the third wall; and
      a shock absorber located on the protuberance between the chassis and the cage.

7. The chassis as claimed in claim 6, wherein the indentations are formed on corresponding positions on each wall of the first wall and the third wall.

8. The chassis as claimed in claim 6, wherein the indentations are formed on corresponding positions on each wall of the second wall and the fourth wall.

9. The chassis as claimed in claim 6, wherein the shock absorber is one of rubber, neoprene, and silicone.

10. The chassis as claimed in claim 6, wherein the cage comprises a first mounting bracket formed on the first wall and a second mounting bracket formed on the third wall.

11. The chassis as claimed in claim 6, wherein a thickness of the first wall, the second wall, the third wall, and the fourth wall is about 0.8 mm.

12. An electronic device comprising:
    an electronic component; and
    a chassis comprising:
       a body portion; and
       a cage mounted on the body portion, wherein the cage is to accommodate the electronic component, and wherein the cage is formed as a rectangular enclosure having a pair of lateral walls comprising a second wall and a fourth wall, a mesh structure formed on the second wall to allow heat generated during operation of the electronic component to escape, and a pair of vertical walls comprising a first wall and a third wall, the cage comprising:
          a protuberance further extends from the second wall away from the rectangular enclosure;
          a shock absorber is located on the protuberance between the chassis and the cage;
          an indentation formed on each of the pair of lateral walls to form a gap therebetween, wherein the gap is smaller than another gap between the pair of lateral walls, the indentations are substantially rectangularly shaped and differently sized, and the third wall includes an aperture located adjacent to an indentation included on the third wall and spanning a length of the indentation on the third wall.

13. The electronic device as claimed in claim 12, wherein the cage further comprises an indentation formed on each of the pair of vertical walls.

14. The electronic device as claimed in claim 12, wherein the electronic component is one of a hard disk drive (HDD), a solid-state drive (SSD), and an optical disk drive (ODD).

15. The electronic device as claimed in claim 12, wherein the cage comprises a mounting bracket formed on each of the pair of lateral walls.

* * * * *